United States Patent
Hara

(10) Patent No.: US 7,316,943 B2
(45) Date of Patent: Jan. 8, 2008

(54) METHOD FOR MANUFACTURING SEMICONDUCTOR APPARATUS HAVING DRAIN/SOURCE ON INSULATOR

(75) Inventor: Toshiki Hara, Tokyo (JP)

(73) Assignee: Seiko Epson Corporation, Nishi-Shinjuku, Shinjuku-ku, Tokyo (JP)

( * ) Notice: Subject to any disclaimer, the term of this patent is extended or adjusted under 35 U.S.C. 154(b) by 0 days.

(21) Appl. No.: 11/486,849

(22) Filed: Jul. 13, 2006

(65) Prior Publication Data

US 2007/0020828 A1   Jan. 25, 2007

(30) Foreign Application Priority Data

Jul. 13, 2005   (JP)  .............................. 2005-203917

(51) Int. Cl.
*H01L 21/00* (2006.01)
*H01L 21/84* (2006.01)

(52) U.S. Cl. .................. 438/149; 438/151; 257/E21.32

(58) Field of Classification Search ................ 438/149, 438/151, 197, 199, 311, 479, 517; 257/E21.32
See application file for complete search history.

(56) References Cited

U.S. PATENT DOCUMENTS 5,882,958 A * 3/1999 Wanlass ..................... 438/149
2005/0098094 A1  5/2005 Oh et al.

FOREIGN PATENT DOCUMENTS

| JP | 2000-124092 | 4/2000 |
| JP | 2002-299591 | 10/2002 |
| KR | 2005-0044140 | 5/2005 |

OTHER PUBLICATIONS

He, et al., "Measurement and Simulation of Electrical and Thermal Property of Drain and Source on Insulator MOSFET's (DSOI)," IEEE International SOI Conference, pp. 55-57 (2002).

* cited by examiner

*Primary Examiner*—Hoai V Pham
(74) *Attorney, Agent, or Firm*—Edwards Angell Palmer & Dodge, LLP; John (Jack) J. Penny, Jr.

(57) ABSTRACT

A method for manufacturing a semiconductor apparatus, comprises:
  forming a first semiconductor layer on a semiconductor substrate of a transistor formation region;
  etching and removing a part of the first semiconductor layer sandwiched by a source formation region and a drain formation region to form a groove section in which a surface of the semiconductor substrate is exposed in the first semiconductor layer;
  forming a second semiconductor layer having an etching selectivity smaller than that of the first semiconductor layer on the semiconductor substrate of the transistor formation region so that the groove section is filled and the surface of the first semiconductor layer is covered;
  etching and removing the first semiconductor layer under the second semiconductor layer from the outside of the transistor formation region to form a cavity section under the second semiconductor layer; and
  forming a buried oxide film in the cavity section.

5 Claims, 3 Drawing Sheets

METHOD FOR MANUFACTURING SEMICONDUCTOR APPARATUS HAVING DRAIN/SOURCE ON INSULATOR

BACKGROUND OF THE INVENTION

1. Technical Field

The present invention relates to a method for manufacturing a semiconductor apparatus and the semiconductor apparatus. In particular, the invention relates to a method for manufacturing a semiconductor apparatus and the semiconductor apparatus by which the generation of defective crystallization during the manufacture can be suppressed without requiring a special production apparatus.

2. Related Art

A field effect type transistor formed on an silicon on insulator (SOI) substrate (hereinafter referred to as "SOI transistor") has attracted attention for the usefulness because elements can be separated easily, it is latchup free, and it has a small source/drain junction capacity for example. A complete depletion type SOI transistor in particular, which consumes a low power and can be operated with a high speed and can be easily driven with a low voltage, has been actively researched in order to operate the SOI transistor with a complete depletion mode. SOI substrates used here include, for example, an Separation by Implanted Oxygen (SIMOX) substrate and a laminated substrate as disclosed in JP-A-2002-299591 and JP-A-2000-124092.

On the other hand, oxide silicon ($SiO_2$) has a lower thermal conductivity than that of silicon (Si). Thus, an SOI device has an operating temperature that is higher than that of a conventional silicon device. This phenomenon is called as a self-heat effect that is one of causing factors of deteriorating the performance and reliability of the device.

The SOI transistor has another problem of a substrate floating effect. This effect causes influences according to one of which an end of a drain of an Nch transistor for example has a hole due to the impact ion and this hole is accumulated in the body, which deteriorates the pressure resistance.

In order to solve the problem as described above, a DSOI (Drain/Source on Insulator) transistor has been suggested in which only the source/drain has an SOI structure (see Ping He, et al. IEEE International SOI Conference, 2002, p55 for example).

The DSOI transistor disclosed in the publication by ping He, et al. has been manufactured by a method using the above SIMOX method. Specifically, a mask is firstly formed on the entirety of an silicon (Si) substrate and a window is formed at a part at which an SOI structure is desired to be formed (the part is source/drain in this case). Next, oxygen ion is ion-implanted with a high concentration while recognizing a part to be a box as a target. Thereafter, the Si substrate is annealed with a high temperature to form a $SiO_2$ region at a depth of the box under the source/drain. According to this method, the $SiO_2$ region is formed only under the source/drain and no $SiO_2$ region is formed under a channel. Thus, this method could have suppress the self-heat effect and the substrate floating effect.

Jp-A-2002-299591 is an example of related art.
Jp-A-2000-124092 is an example of related art.
The publication by ping He, et al. (IEEE International SOI Conference, 2002, p55) is an example of related art.

However, the above method for manufacturing a DSOI transistor requires a Si substrate to be heated during the implantation of oxygen ion because the crystalline characteristic of the Si substrate must be maintained. Thus, a so-called "HOT-impra apparatus" is required. The above method also requires, in order to form a $SiO_2$ region under the source/drain, "high temperature anneal furnace" capable of providing heat treatment with a temperature of 1300 degrees or more. In other words, the above method has required special apparatuses for performing the SIMOX method and electric power for operating them, which causes an increased cost and a larger burden to environment (problem 1).

Furthermore, the above method for manufacturing a DSOI transistor has caused a risk in which the oxygen ion implantation with a high concentration may cause defective crystallization in a Si substrate and this defect may cause an adverse effect on the device characteristic (problem 2).

SUMMARY

An advantage of the invention is to provide a method for manufacturing a semiconductor apparatus having a DSOI transistor by which a special production apparatus and burden by the apparatus to environment are reduced to suppress the generation of defective crystallization during the manufacture, and the semiconductor apparatus.

According to a first aspect of the Invention, a method for manufacturing a semiconductor apparatus includes: forming a first semiconductor layer on a semiconductor substrate of a transistor formation region; etching and removing a part of the first semiconductor layer sandwiched by a source formation region and a drain formation region to form a groove section in which a surface of the semiconductor substrate is exposed in the first semiconductor layer; forming a second semiconductor layer having an etching selectivity smaller than that of the first semiconductor layer on the semiconductor substrate of the transistor formation region so that the groove section is filled and the surface of the first semiconductor layer is covered; etching and removing the first semiconductor layer under the second semiconductor layer from the outside of the transistor formation region to form a cavity section under the second semiconductor layer; and forming a buried oxide film in the cavity section.

The term "semiconductor substrate" here represents, for example, a bulk silicon (Si) substrate and the term "the first semiconductor layer" represents, for example, a silicon germanium (SiGe) layer. The term "the second semiconductor layer" represents, for example, a Si layer. The first semiconductor layer and the second semiconductor layer as described above are formed by the epitaxial growth method for example.

The method for manufacturing a semiconductor apparatus of the first aspect of the invention can eliminate the need for a special production apparatus as used in the SIMOX method (e.g., HOT-impra apparatus, high temperature anneal furnace). Thus, a DSOI transistor that suppresses the generation of defective crystallization during the manufacture can be provided with a low cost and without causing a burden to an environment by the consumption of a large amount of electric power.

According to a second aspect of the invention, a method for manufacturing a semiconductor apparatus includes: forming a first semiconductor layer on a semiconductor substrate; etching and removing a part of the first semiconductor layer sandwiched by a source formation region and a drain formation region to form a groove section in which a surface of the semiconductor substrate is exposed in the first semiconductor layer; forming a second semiconductor layer having an etching selectivity smaller than that of the first semiconductor layer on the semiconductor substrate so that the groove section is filled and the surface of the first semiconductor layer is covered; sequentially etching and removing the second semiconductor layer exterior to a transistor formation region and the first semiconductor layer exterior to the second semiconductor layer to expose an end section of the first semiconductor layer along the periphery of the transistor formation region; etching and removing the first semiconductor layer from the exposed end section to form a cavity section under the second semiconductor layer of the transistor formation region; and forming a buried oxide film in the cavity section.

The structure as described above can eliminate the need for a special production apparatus as used in the SIMOX method (e.g., HOT-impra apparatus, high temperature anneal furnace). Thus, a DSOI transistor that suppresses the generation of defective crystallization during the manufacture can be provided with a low cost and without causing a burden to an environment by the consumption of a large amount of electric power.

According to a third aspect of the invention, a method for manufacturing a semiconductor apparatus includes: forming a first semiconductor layer on a semiconductor substrate; forming, on the first semiconductor layer, a semiconductor layer A having an etching selectivity smaller than that of the first semiconductor layer; etching and removing a part of a layered structure composed of the first semiconductor layer and the semiconductor layer A that is sandwiched by a source formation region and a drain formation region to form a groove section in which a surface of the first semiconductor layer is exposed in the layered structure; forming, on the semiconductor substrate, a semiconductor layer B made of the same material as that of the semiconductor layer A so that the groove section is filled and the surface of the first semiconductor layer is covered; sequentially etching and removing a part exterior to a transistor formation region of the second semiconductor layer composed of the semiconductor layer A and the semiconductor layer B and the first semiconductor layer exterior to the second semiconductor layer to expose an end section of the first semiconductor layer along a periphery of the transistor formation region; etching and removing the first semiconductor layer from the exposed end section to form a cavity section under the second semiconductor layer of the transistor formation region) and forming a buried oxide film in the cavity section.

Here, the terms "semiconductor layer A" and "semiconductor layer B" represent a Si layer for example. The semiconductor layer A and the semiconductor layer B as described above are formed by the epitaxial growth method for example.

The method for manufacturing a semiconductor apparatus of Invention 3 can eliminate the need for a special production apparatus as used in the SIMOX method (e.g., HOT-impra apparatus, high temperature anneal furnace). Thus, a DSOI transistor that suppresses the generation of defective crystallization during the manufacture can be provided with a low cost and without causing a burden to an environment by the consumption of a large amount of electric power.

Furthermore, this method for manufacturing a semiconductor apparatus can form a structure in which only the second semiconductor layer of a source formation region and a drain formation region is thick and the surface is provided at a position above the surface of the second semiconductor layer under a gate electrode (i.e., elevated source/drain structure). For example, it is possible, by forming the semiconductor layer A to be thick, to selectively form only the second semiconductor layer of the source formation region and the drain formation region to be thick. This can eliminate, for example, an inconvenience where a plug electrode or the like having a contact with a source layer and a drain layer reaches a buried oxide film.

According to a fourth aspect of the invention, the method for manufacturing a semiconductor apparatus of the third aspect of the invention further includes: forming, after the formation of the second semiconductor layer, an antioxidant film on the second semiconductor layer; wherein the exposing an end section of the first semiconductor layer includes: sequentially etching and removing a part of the antioxidant film exterior to a transistor formation region and the second semiconductor layer and the first semiconductor layer exterior to the antioxidant film to expose an end section of the first semiconductor layer along the transistor formation region Here, the term an antioxidant film represents, for example, a film having a layered structure composed of a silicon oxide film ($SiO_2$) and a silicon nitride film ($Si_3N_4$). The film as described above is formed by the CVD method for example.

The method for manufacturing a semiconductor apparatus of the fourth aspect of the invention can use the antioxidant film to prevent, even when the second semiconductor substrate is subjected to heat treatment, the upper face of the second semiconductor layer from being oxidized. Thus, the second semiconductor layer and the semiconductor substrate can be thermally-oxidized to form a buried oxide film in a cavity section.

According to a fifth aspect of the invention, in the method for manufacturing a semiconductor apparatus of the fourth aspect of the invention, the forming a buried oxide film in the cavity section includes; thermally-oxidizing the second semiconductor layer and the semiconductor substrate to form the buried oxide film in the cavity section.

The structure as described above can closely form a buried oxide film in a cavity section.

According to a sixth aspect of the invention, the method for manufacturing a semiconductor apparatus of the fourth aspect of the invention includes: etching and removing, after the formation of a buried oxide film in the cavity section, the antioxidant film; forming, via a gate insulation film, a gate electrode on a part of the second semiconductor layer sandwiched by the source formation region and the drain formation region in which the antioxidant film is removed; and forming a source layer in the second semiconductor layer of the source formation region and forming a drain layer in the second semiconductor layer of the drain formation region.

The structure as described above can provide a semiconductor apparatus including a DSOI transistor having an elevated source/drain structure (i.e., DSOI device).

A semiconductor apparatus of a seventh aspect of the invention includes: a transistor structured to include a gate electrode formed on a semiconductor layer on a semiconductor substrate via a gate insulation film and a source layer and a drain layer formed in the semiconductor layer to sandwich the gate electrode; wherein buried oxide films are respectively provided between the source layer and the semiconductor substrate and between the drain layer and the semiconductor substrate and no buried oxide film is provided between the semiconductor layer under the gate electrode and the semiconductor substrate; and the semiconductor layer in which the source layer and the drain layer are formed has a thick thickness and the surface thereof is provided at a position above the surface of the semiconductor layer under the gate electrode. Here, the expression "the semiconductor layer in which the source layer and the drain layer are formed has a thick thickness" means that the semiconductor layer has a thick thickness so that, when a plug electrode or the like is formed on the source layer and the drain layer, the plug electrode is at least prevented from protruding from the semiconductor layer to reach the buried oxide film under the semiconductor layer.

The semiconductor apparatus of the seventh aspect of the invention can eliminate, for example, an inconvenience where a plug electrode or the like having a contact with a source layer and a drain layer reaches a buried oxide film.

BRIEFED DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

FIG. 1A to FIG. 3C are a cross-sectional view illustrating a method for manufacturing a semiconductor apparatus according to embodiments of the invention.

Figure 1A:
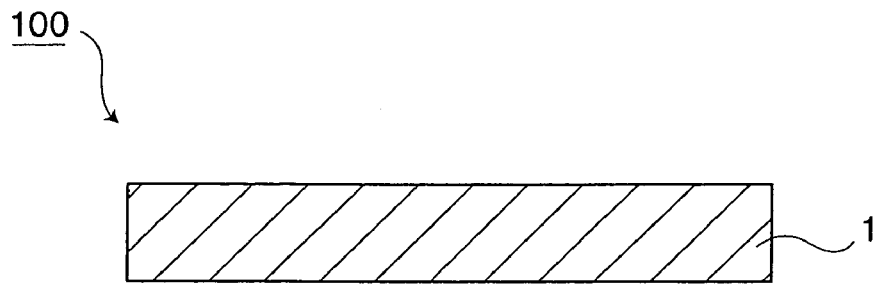
FIGS. 1A to 1C illustrate a method for manufacturing a semiconductor apparatus according to a first embodiment.
Figure 1B:
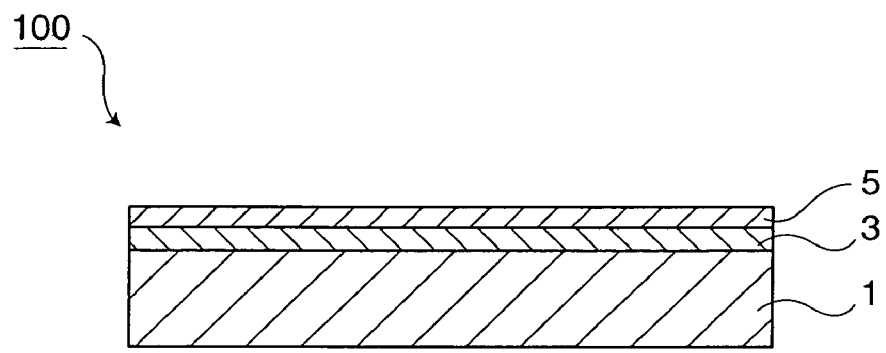

As shown in FIG. 1A, a Si substrate 1 as a bulk silicon wafer is prepared. Next, as shown in FIG. 1B, a SiGe layer 3 is formed on this Si substrate 1 and a first Si layer 5 is formed on the SiGe layer 3. The SiGe layer 3 and the Si layer 5 are formed by the epitaxial growth method (or selective epitaxial growth method), respectively.

When the Si substrate 1 is subjected to a dry etching processing prior to the formation of the SiGe layer 3, the dry etching processing may cause damage to the Si substrate 1. In order to remove this damage, the surface of the Si substrate 1 may be slightly oxidized prior to the formation of the SiGe layer 3 to subsequently remove the oxide film by a wet etching.

Figure 1C:
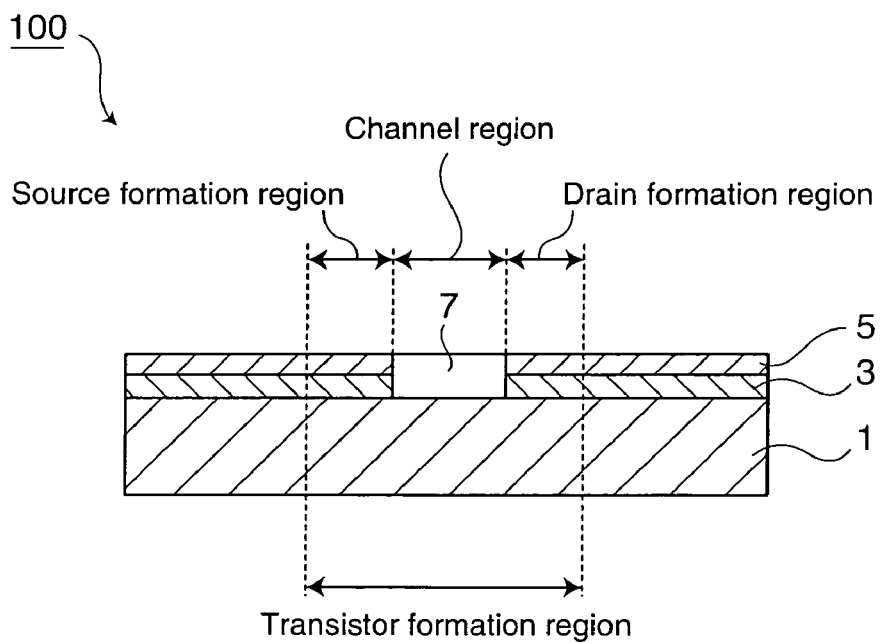

Next, as shown in FIG. 1C, a photolithography technique and an etching technique are used to form a trench (groove section) 7 at which the surface of the Si substrate 1 is exposed in the layered structure composed of the SiGe layer 3 and the Si layer 5. This trench 7 is formed at a position in a transistor formation region that is sandwiched by a source formation region and a drain formation region (hereinafter referred to as "channel region").

Figure 2A:
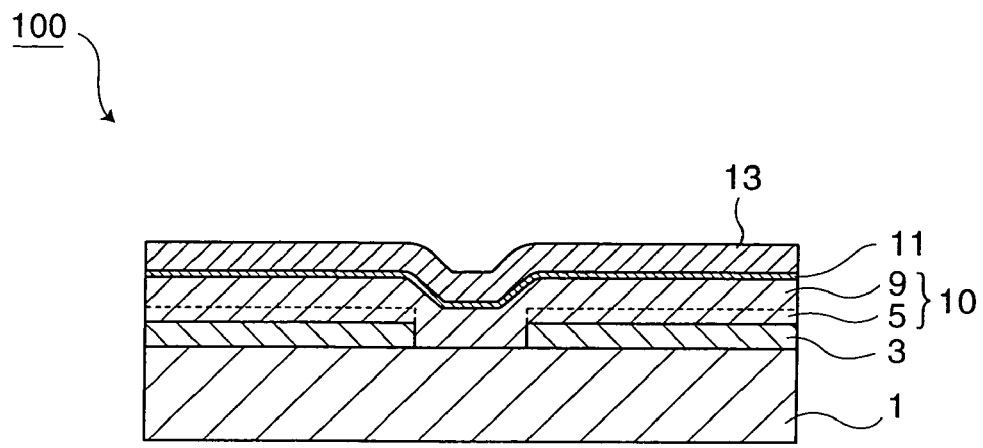
FIGS. 2A to 2c illustrate a method for manufacturing a semiconductor apparatus according to a second embodiment.

Next, as shown in FIG. 2A, a second Si layer 9 is formed on the Si substrate 1 so that this trench is buried and the Si layer 1 is covered by the second Si layer 9. This second Si layer 9 is formed by the epitaxial growth method (or selective epitaxial growth method).

In order to remove the damage formed in the Si substrate 1 by the dry etching processing for forming the trench, the surfaces of the Si substrate 1 and the Si layer 5 also may be slightly oxidized prior to the formation of the Si layer 9 and then the oxide film may be removed by a wet etching. In the following section, the first and second Si layers 5 and 9 will be referred to as the Si layer 10.

Next, this Si substrate 1 having thereon the Si layer 10 is thermally-oxidized to form an oxide ($SiO_2$) film 11 on the surface of the Si layer 10. The oxide ($SiO_2$) film 11 is a base of a silicon nitride film ($Si_3N_4$) film. Then, a $Si_3N_4$ film 13 is formed on this $SiO_2$ film 11. This $Si_3N_4$ film 13 is a film for preventing the surface of the Si layer 10 from being oxidized when a Si substrate 1 is thermally-oxidized by a subsequent step. This $Si_3N_4$ film 13 is formed by CVD for example.

Figure 2B:
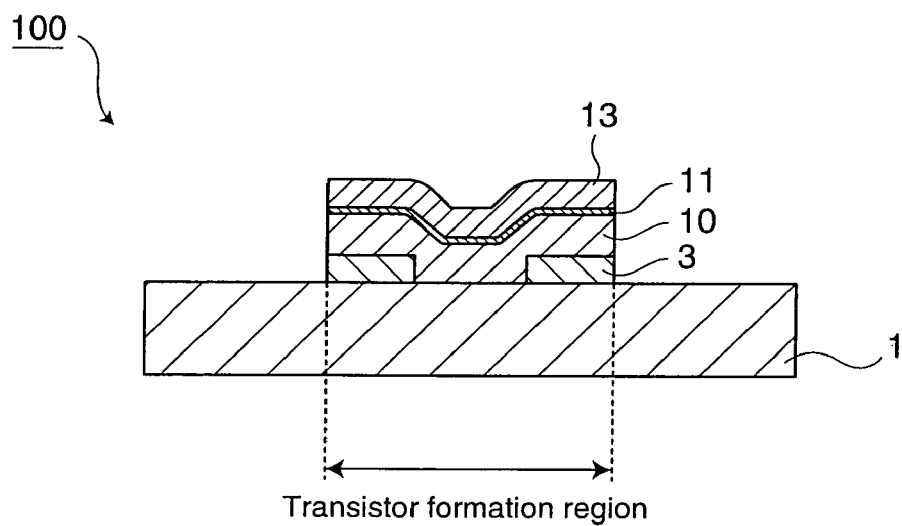

Next, as shown in FIG. 2B, a photolithography technique and an etching technique are used to sequentially etch and remove the $Si_3N_4$ film 13, the $SiO_2$ film, the Si layer 10, and the SiGe layer 3 exterior to the transistor formation region (i.e., elements are separated). As a result, the $Si_3N_4$ film 13, the $SiO_2$ film 11, the Si layer 10, and the side face of the SiGe layer 3 (end section) are exposed along the periphery of the transistor formation region.

Figure 2C:
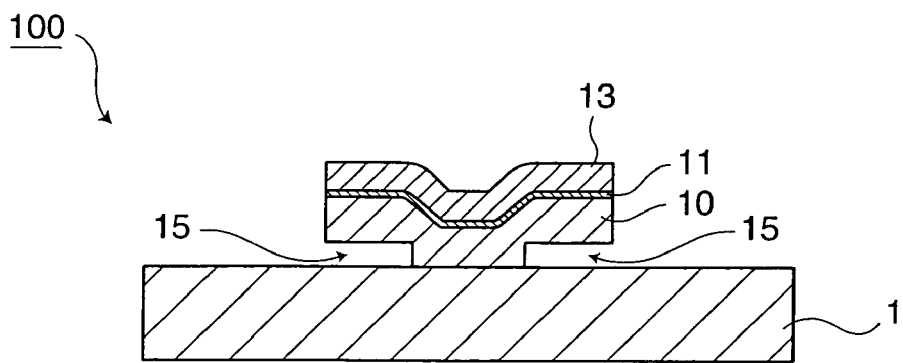

Next, as shown in FIG. 2C, the SiGe layer 3 is etched by etching solution (e.g., fluoro-nitric acid) from the exposed side face (i.e., from the side). Since this wet etching using fluoro-nitric acid uses an etching selectivity between SiGe and Si of about 100:1 for example, only the SiGe layer 3 can be selectively removed while preventing the Si layer 10 from being excessively etched. As shown in FIG. 2C, the SiGe layer 3 is completely removed to form a cavity section 15 under the Si layer 10 of the transistor formation region. This Si layer 10 on the cavity section 15 is a source formation region or a drain formation region.

Figure 3A:
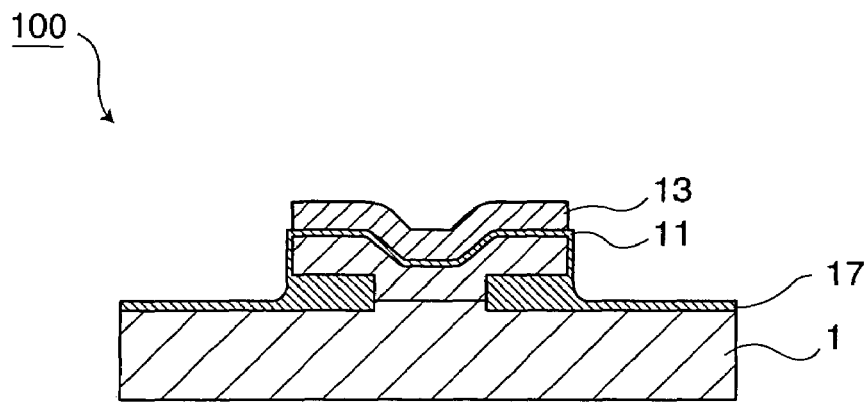
FIGS. 3A to 3C illustrate a method for manufacturing a semiconductor apparatus according to third embodiment.

Next, the Si substrate 1 and the Si layer 10 are thermally-oxidized. As a result, as shown in FIG. 3A, a $SiO_2$ film (i.e., box) 17 is formed so as to fill the cavity section between the Si substrate 1 and the Si layer 10. When the cavity section is insufficiently filled by the $SiO_2$ film 17 in FIG. 3A, the thermal oxidization also may be followed by a method such as CVD for accumulating a $SiO_2$ film or the like in the cavity section.

Thereafter, $SiO_2$ is accumulated on the entire substrate by a method such as CVD and the surface of the device is made flat by a method such as CMP and elements are separated. During this process, the $Si_3N_4$ film functions as an etching stopper in the CMP.

Figure 3B:
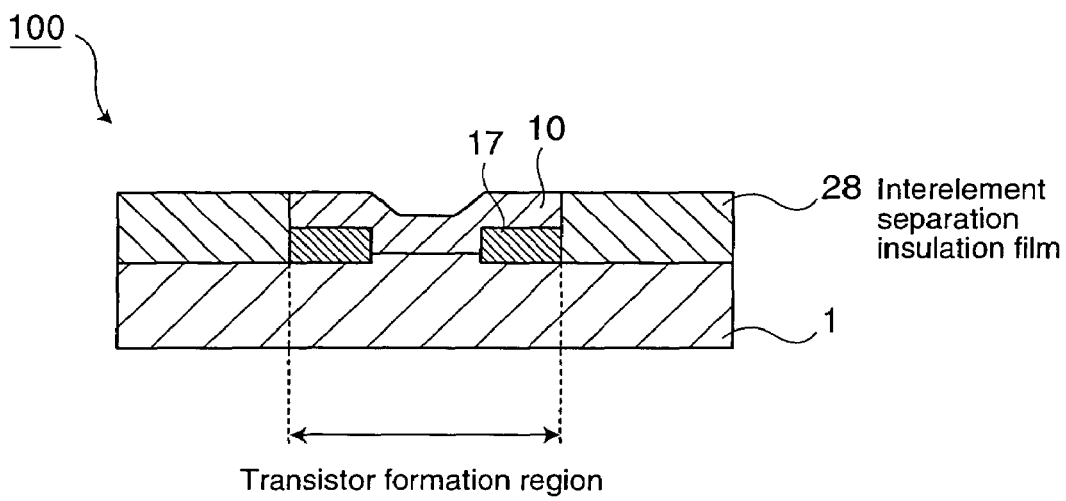

Thereafter, the $Si_3N_4$ film 13 is etched and removed in FIG. 3A. Then, the $SiO_2$ film 11 as a base of the $Si_3N_4$ film 13 is etched and removed and the surface of the Si layer 10 in the transistor formation region is exposed as shown in FIG. 3B. The subsequent steps are the same as those for forming a transistor.

Figure 3C:
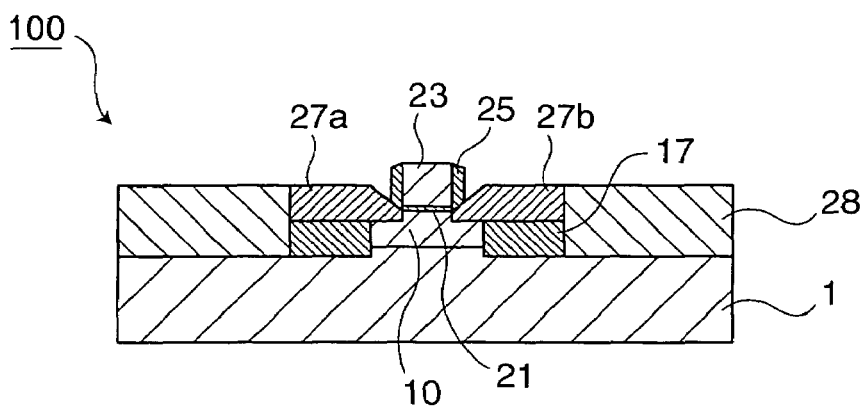

For example, the surface of the Si layer 10 is subjected to an ion implantation (i.e., channel ion implantation) for adjusting a threshold value. Next, the Si layer 10 is thermally-oxidized to have a gate oxide film 21 on the surface. Then, as shown in FIG. 3C, a gate electrode 23 is formed on the gate oxide film 21 of the channel region. Then, LDD (lightly doped drain) implantation is performed by using this gate electrode 23 as a mask to subsequently form a side wall 25 at the side face of the gate electrode 23. Then, the Si layer 10 of the source formation region and the drain formation region is ion-implanted with impurities such as As, P, or B while using the gate electrode 23 and the side wall 25 as a mask to form a source layer 27a and a drain layer 27b, thereby completing a DSOI transistor 100.

As described above, the method for manufacturing a semiconductor apparatus according to the embodiment of the invention eliminates the need for a special production apparatus as used in the SIMOX method (e.g., HOT-impra apparatus, high temperature anneal furnace). Thus, a DSOI transistor that suppresses the generation of defective crystallization during the manufacture can be provided with a low cost and without causing a burden to an environment by the consumption of a large amount of electric power.

Furthermore, this method for manufacturing a semiconductor apparatus can form a DSOI transistor in which a part of the Si layer 10 at which the source layer 27a and the drain layer 27b are formed so that only this part is thick and so that the surfaces are at a position higher than the position of the surface of the Si layer 10 under the gate electrode 23 (i.e., elevated source/drain structure). For example, by forming the Si layer 5 to be thick, only the Si layer 10 of the source formation region and the drain formation region can be selectively formed to be thick. This can eliminate an inconvenience where a plug electrode (not shown) reaches the $SiO_2$ film (box) 17 when the plug electrode is formed on the source layer 27a and the drain layer 27b for example.

In this embodiment, the Si substrate 1 corresponds to "semiconductor substrate" of the invention and the SiGe layer 3 corresponds to "the first semiconductor layer" of the invention. The first Si layer 5 corresponds to "semiconductor layer A" of the invention and the second Si layer 9 corresponds to "semiconductor layer B" of the invention. The first Si layer 5 and the second Si layer 9 compose the Si layer 10 that corresponds to "the second semiconductor layer (or semiconductor layer)" of the invention. The trench 7 corresponds to "groove section" of the invention and the $SiO_2$ film 17 corresponds to "buried oxide film" of the invention. The $SiO_2$ film 11 and the $Si_3N_4$ film 13 correspond to "antioxidant film" of the invention and the gate oxide film 21 corresponds to "gate insulation film" of the invention.

This embodiment has described a case as shown in FIG. 2C and FIG. 3A in which the Si substrate 1 and the Si layer 10 are thermally-oxidized to form the $SiO_2$ film 17 in the cavity section 15. However, a method for forming a $SiO_2$ film in the cavity section 15 is not limited to this. For example, a $SiO_2$ film also may be formed in the cavity section 15 by CVD using TEOS (tetra ethyl ortho silicate). TEOS has a high flowability at the surface of a film and thus a $SiO_2$ film also can be formed in the cavity section 15 in which only a side is opened.

This embodiment also has described a case as shown in FIG. 1B in which the SiGe layer 3 and the first Si layer 10 and the second Si layer 10 are respectively formed at the entire surface of the Si substrate 1. However, another configuration also may be used where these layers are not formed at the entire surface of the Si substrate 1 and are formed only at the transistor formation region and are not formed at a region other than the transistor formation region (e.g., element separation region). For example, the SiGe layer 3 and the Si layer 10 for example also may be formed by the selective epitaxial growth method while the surface of the Si substrate 1 of the element separation region being covered by a $SiO_2$ film.

The method as described above also can eliminate, as in the case of the above embodiment, the need for a special production apparatus as used in the SIMOX method. Thus, a DSOI transistor that suppresses the generation of defective crystallization during the manufacture can be provided with a low cost and without causing a burden to an environment by the consumption of a large amount of electric power.

Furthermore, this embodiment has described a case where material of "semiconductor substrate" is Si, material of "the first semiconductor layer" is SiGe, and material of "the second semiconductor layer" is Si. However, these materials are not limited to them. For example, "semiconductor substrate" also may be made of material such as Si, Ge, SiGe, SiC, SiSn, PbS, GaAs, InP, GaP, GaN, or ZnSe. Material of "the first semiconductor layer" also may be the one having a higher etching selectivity than those of the Si substrate 1 and the second semiconductor layer. For example, materials of "the first semiconductor layer" and "the second semiconductor layer" may use a combination selected from Si, Ge, SiGe, SiC, SiSn, PbS, GaAs, InP, GaP, GaN, or ZnSe.

The entire disclosure of Japanese patent application No.2005-203917, field Jul. 13, 2005 is expressly incorporated by reference herein.

What is claimed is:

1. A method for manufacturing a semiconductor apparatus, comprising:

forming a first semiconductor layer on a semiconductor substrate;

etching and removing a part of the first semiconductor layer sandwiched by a source formation region and a drain formation region to form a groove section in which a surface of the semiconductor substrate is exposed in the first semiconductor layer;

forming a second semiconductor layer having an etching selectivity smaller than that of the first semiconductor layer on the semiconductor substrate so that the groove section is filled and the surface of the first semiconductor layer is covered;

sequentially etching and removing the second semiconductor layer exterior to a transistor formation region and the first semiconductor layer exterior to the transistor formation region to expose an end section of the first semiconductor layer along the periphery of the transistor formation region, wherein the sequentially etching and removing being stopped on a top surface of the semiconductor layer;

etching and removing the first semiconductor layer from the exposed end section to form a cavity section under the second semiconductor layer of the transistor formation region; and forming a buried oxide film in the cavity section.

2. A method for manufacturing a semiconductor apparatus, comprising:

forming a first semiconductor layer on a semiconductor substrate;

forming, on the first semiconductor layer, a semiconductor layer A having an etching selectivity smaller than that of the first semiconductor layer;

etching and removing a part of a layered structure composed of the first semiconductor layer and the semiconductor layer A that is sandwiched by a source formation region and a drain formation region to form a groove section in which a surface of the first semiconductor layer is exposed in the layered structure;

forming, on the semiconductor substrate, a semiconductor layer B made of the same material as that of the semiconductor layer A so that the groove section is filled and the surface of the first semiconductor layer is covered;

sequentially etching and removing a part exterior to a transistor formation region of the second semiconductor layer composed of the semiconductor layer A and the semiconductor layer B and the first semiconductor layer exterior to the transistor formation region to expose an end section of the first semiconductor layer along a periphery of the transistor formation region, wherein the sequentially etching and removing being stopped on a top surface of the semiconductor layer;

etching and removing the first semiconductor layer from the exposed end section to form a cavity section under the second semiconductor layer of the transistor formation region; and forming a buried oxide film in the cavity section.

3. The method for manufacturing a semiconductor apparatus according to claim 2, wherein:
   the method includes forming, after the formation of the second semiconductor layer, an antioxidant film on the second semiconductor layer;
   the exposing an end section of the first semiconductor layer includes:
   sequentially etching and removing a part of the antioxidant film exterior to a transistor formation region and the second semiconductor layer and the first semiconductor layer exterior to the transistor formation region to expose an end section of the first semiconductor layer along the transistor formation region.

4. The method for manufacturing a semiconductor apparatus according to claim 3, wherein
   the forming a buried oxide film in the cavity section includes;
   thermally-oxidizing the second semiconductor layer and the semiconductor substrate to form the buried oxide film in the cavity section.

5. The method for manufacturing a semiconductor apparatus according to claim 3, comprising:
   etching and removing, after the formation of a buried oxide film in the cavity section, the antioxidant film;
   forming, via a gate insulation film, a gate electrode on a part of the second semiconductor layer sandwiched by the source formation region and the drain formation region in which the antioxidant film is removed; and
   forming a source layer in the second semiconductor layer of the source formation region and forming a drain layer in the second semiconductor layer of the drain formation region.

* * * * *